United States Patent [19]

Langendorf

[11] Patent Number: 5,256,994
[45] Date of Patent: Oct. 26, 1993

[54] PROGRAMMABLE SECONDARY CLOCK GENERATOR

[75] Inventor: Brian K. Langendorf, El Dorado Hills, Calif.

[73] Assignee: Intel Corporation, Santa Clara, Calif.

[21] Appl. No.: 948,215

[22] Filed: Sep. 21, 1992

[51] Int. Cl.⁵ ............................................. H03L 7/199
[52] U.S. Cl. ...................................... 331/16; 331/1 A
[58] Field of Search ...................... 331/16, 18, 25, 1 A

[56] References Cited

U.S. PATENT DOCUMENTS

| | | | |
|---|---|---|---|
| 3,383,619 | 5/1968 | Naubereit et al. | 331/16 |
| 4,528,523 | 7/1985 | Crowley | 331/16 X |
| 4,968,950 | 11/1990 | Babin et al. | 331/1 A |

Primary Examiner—David Mis
Attorney, Agent, or Firm—Blakely, Sokoloff, Taylor & Zafman

[57] ABSTRACT

A secondary clock generator circuit is described in which a ratio is programmed into circuitry which will be embedded on all components. The programmable circuitry takes the system's master clock signal multiplies it by the programmed ratio and yields a secondary clock signal equal to the ratio times the master clock signal for driving components and interfaces. The invention is particularly useful in computer systems operating at a first clock frequency which have replaceable components that run at different clock frequencies and where it is desired to provide a synchronization between the system clock and the various component clocks.

6 Claims, 3 Drawing Sheets

PROGRAMMABLE SECONDARY CLOCK GENERATOR

BACKGROUND OF THE INVENTION

1. Field of the Invention

The present invention relates to circuitry for use by interfaces in computer systems; more specifically, the present invention relates to circuitry for generating clock signals of a desired frequency for interfaces.

2. Art Background

Computer systems are generally divided into a group of components. These components are generally driven by a common "clock" or signal line carrying a signal of a predetermined frequency. The phases of the clock signal are used for sequencing logic in integrated circuits, as well as for enabling memory arrays and other components in a computer system. The clock signal is provided to the various components in the computer system and components typically carry out their operation or set of operations during one or more clock cycles.

In the past, it has been quite common for all the components of the computer system to be driven by the same clock reference signal. This has required that computer designers design computer systems around a target operating clock frequency. Systems designed to operate at a single clock frequency are difficult to upgrade with components that operate at different clock frequencies. In order to accomodate faster components while still supporting slower components, modifications are required for the clock generation hardware. Modifying the clocking hardware results in additional expense to upgrade, less design reuse and longer time periods between design and marketing.

In those computer systems where some components operate with faster clock cycles than others, the hardware that propagates the reference clock signal to the components have had to be sensitive to introducing a clock skew. Skew refers to the phase difference between the reference clock and the clock signal seen by each of the components. These offsets may occur due to propagation delays in the circuitry. As clock frequencies increase, the allowable error margin to account for skew decreases. Frequency multiplication is traditionally performed using a simple and well known circuit which utilizes a phase locked loop (PLL). A basic frequency multiplier using a PLL is described in Horowitz & Hill, *The Art of Electronics*, 2d ed. Cambridge University Press, 1989, P. 647. Such a circuit can generate only whole multiples of the input clock frequency, thereby not accounting for secondary clock frequencies which are not integer multiples of the reference clock.

At the present, when it is desirable to upgrade a computer system to utilize faster components or a faster reference clock signal, it is necessary to replace all the components requiring the previous target clock signal. If a faster CPU is used either all other components must be upgraded or new clock generation circuits must be designed. The two clock domains may also be run asynchronously, so that there is no relation between the fast and slow clock. However, this requires additional clocking crystals which result an increased costs and also necessitates resynchronizing circuitry which yields added costs and performance reduction. The introduction of multiple clock domains introduces further complications that may defeat the purpose of upgrading altogether. Such is the case where a performance critical portion of the system is upgraded to run at a very high frequency but must then be interfaced with another part of the system having a lower frequency.

It would be advantageous, and is therefore an object of the present invention, to develop a programmable interface for components in which a single master clock signal is converted to each component's required clock speed. This can be implemented independent of system configuration.

SUMMARY OF THE INVENTION

It is an object of the present invention to provide a flexible means for interfaces to a computer system to run at different clock speeds from other portions of the computer system without requiring uniquely designed hardware for clock frequency processing for every component.

It is also an object to provide a programmable clocking interface which can be readily altered to accommodate different clock frequencies while minimizing clock skew problems.

These and other objects of the present invention are provided by interface circuitry to be implemented on computer components in which the numerator and denominator representing a desired ratio of an output clock signal to the master clock signal are stored in pattern registers. The denominator that is stored controls division of the master clock signal and the numerator that is stored controls the multiplication of the divided clock signal to yield an output clock signal of the desired ratio to the master clock.

The clock generation circuit of the present invention accepts as an input a master clock signal of a first frequency and provides as an output a secondary clock signal which is equal to the first clock signal multiplied by a programmed ratio. This output is then utilized as the clock input to a particular component. This circuit has useful application in computer systems in which the system clock speed is at one frequency and various components require different clock frequencies. Such a system allows for the replacement of components with alternate components requiring a different clock speed wherein the required clock frequency is supplied merely by programming the new clock ratio into the system. Further, the secondary clock signal is generated without the introduction of clock skew.

DETAILED DESCRIPTION OF THE INVENTION

An apparatus and method for generating a secondary clock signal at a programmed ratio to a master clock signal are described. In the following detailed description, numerous specific details are set forth such as specific circuit components, etc., in order to provide a thorough understanding of the present invention. It will be apparent, however, to one skilled in the art that the present invention may be practiced without such specific details. In other instances, well known components, structures and techniques have not been shown in detail to avoid unnecessarily obscuring the subject matter of the present invention. Particularly, for illustrative purposes, the present invention will be described for a system in which a master clock signal oscillates at 40 megahertz and the desired secondary clock signal is 30 megahertz. These particular values lend themselves well to explaining the present invention, but are in no way to limit the scope of the present invention.

Figure 1:
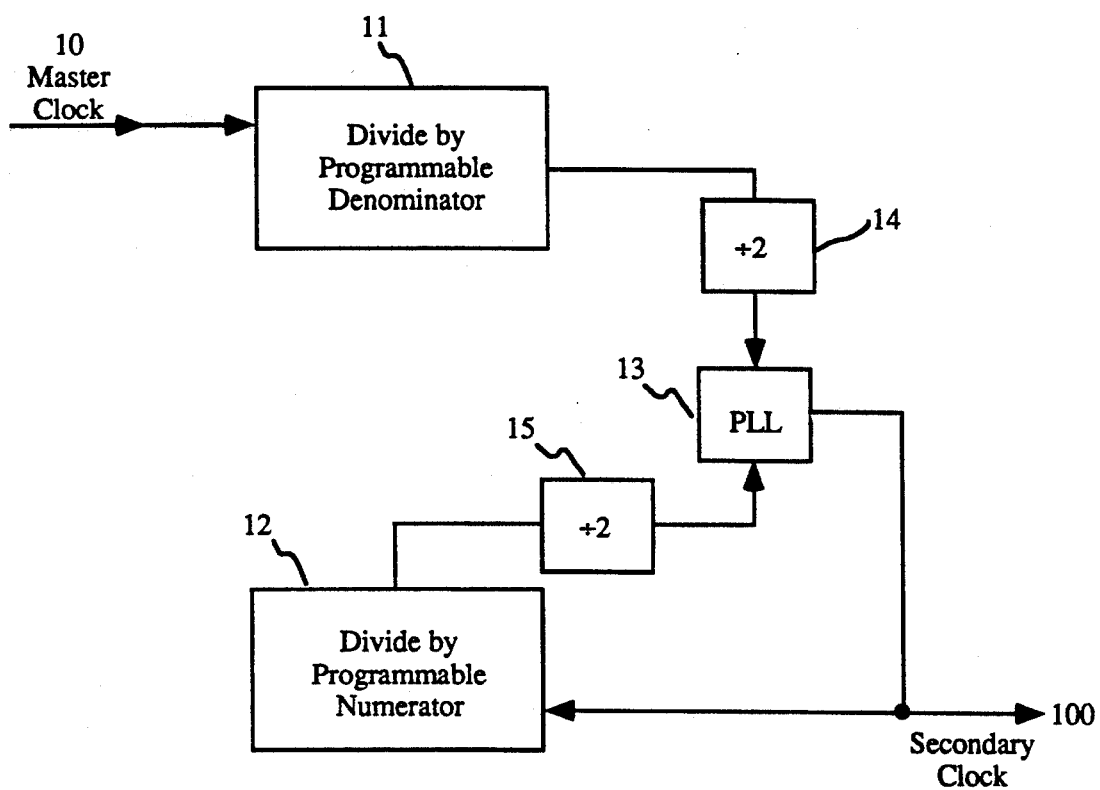
FIG. 1 illustrates a simplified logic diagram of the elements of the present invention.

Referring first to FIG. 1, a general block diagram of the present invention is shown. The circuitry of FIG. 1 will be incorporated to supply the clock input to components which require a clock signal oscillating at a different rate from the master clock signal of the system. The present invention is designed to be programmable such that the same circuitry is used to generate the output frequency regardless of the frequency desired. The output frequency derived from the master clock frequency may be expressed as a ratio of the master clock frequency. This ratio of the secondary clock signal 100 to the master clock signal 10 can be expressed in the form of a fraction N/D. The present invention is not limited to having N be less than D. If N is less than D the secondary clock signal 100 will be slower than the master clock signal 10. If N is greater than D the secondary clock signal 100 will be at a higher frequency than the master clock signal 10.

In FIG. 1, block 11 indicates that the denominator is to be programmed and the master clock signal 11 divided down from the master clock frequency to the master clock frequency divided by the denominator. This signal is further divided by 2 for reasons that will be explained further herein. A phase locked loop (PLL) 13 receives the divided down master clock signal as a reference input.

Next, after dividing the master clock signal 10 down by the programmed denominator, it is necessary to multiply the divided-down clock signal by the numerator of the desired ratio. It is well known that to accomplish this a phase locked loop circuit in conjunction with a divide circuit will yield frequency multiplication. Such a circuit is shown in Horowitz & Hill, *The Art of Electronics*, 2d. Ed., p. 647, which illustrates a frequency multiplier circuit. The PLL 13 uses as its reference frequency the master clock signal 10 divided by the programmable denominator. The PLL locks the second input to the phase comparator to the reference clock input. For example, when the frequency to which it is compared is less than the reference divided signal, the PLL 13 may increase the voltage to its voltage controlled oscillator (VCO) and therefore the frequency of the PLL output signal will increase. Note that the control may be either voltage or current and that increases in the control may have the effect of either raising or lowering the frequency of the signal generated by the VCO depending upon configuration. By dividing the secondary signal by the programmed numerator, the PLL will increase the frequency of the output signal so that it is equal to N times the reference signal. Thus, block 12 divides the secondary clock signal by the programmed numerator which is then further divided by 2 at block 15 and this is applied as the second input to the PLL 13. The PLL using the divided master clock signal as a reference signal controls the frequency of the secondary clock by multiplying the divided reference signal by the programmed numerator. The secondary clock then is equal in frequency to the master clock times the ratio of the programmed numerator divided by the programmed denominator.

The two divide-by-two circuits shown in FIG. 1, blocks 14 and 15, are incorporated because a PLL requires approximately a 50/50 duty cycle. If large ratios are used, the duty cycle seen by the PLL would be far from 50/50 and the PLL would not perform properly. This is because the oscillator in the PLL produces a 50 percent duty cycle clock. The phase comparator looks for different voltage levels or different rising clock edges depending upon the type of comparator incorporated. A signal with a duty cycle not approximately 50/50 would result in an error signal even where the signals are locked. The divide-by-two circuit 14 introduces a 50/50 duty cycle. The divide-by-two circuit 15 in the frequency-multiplier side of the circuit effectively cancels out the divide-by-two circuit 14. That is, the divide-by-two circuitry 15 on the frequency-multiplier side halves the second PLL input causing the secondary clock signal 100 to double, canceling out the divide-by-two circuit 14. Also, any skew introduced by one divide-by-two circuit is cancelled by the other. If the same flip-flop type is used from the same die and in the same operating environment, any delay from clock to Q will be highly correlated for the two divide-by-two circuits. This provides for minimum skew introduced from the divide-by circuits.

Thus, in the example of FIG. 1 if a master clock is operating at 40 megahertz and the interface requires a 30 megahertz clock cycle, the divide circuitry 11 will receive a programmable numerator and denominator such that the master clock is divided by 4. Then the frequency multiplier portion will receive a value so that the master clock divided by 4 will then be tripled to yield a secondary clock frequency of 30 megahertz.

Figure 2:
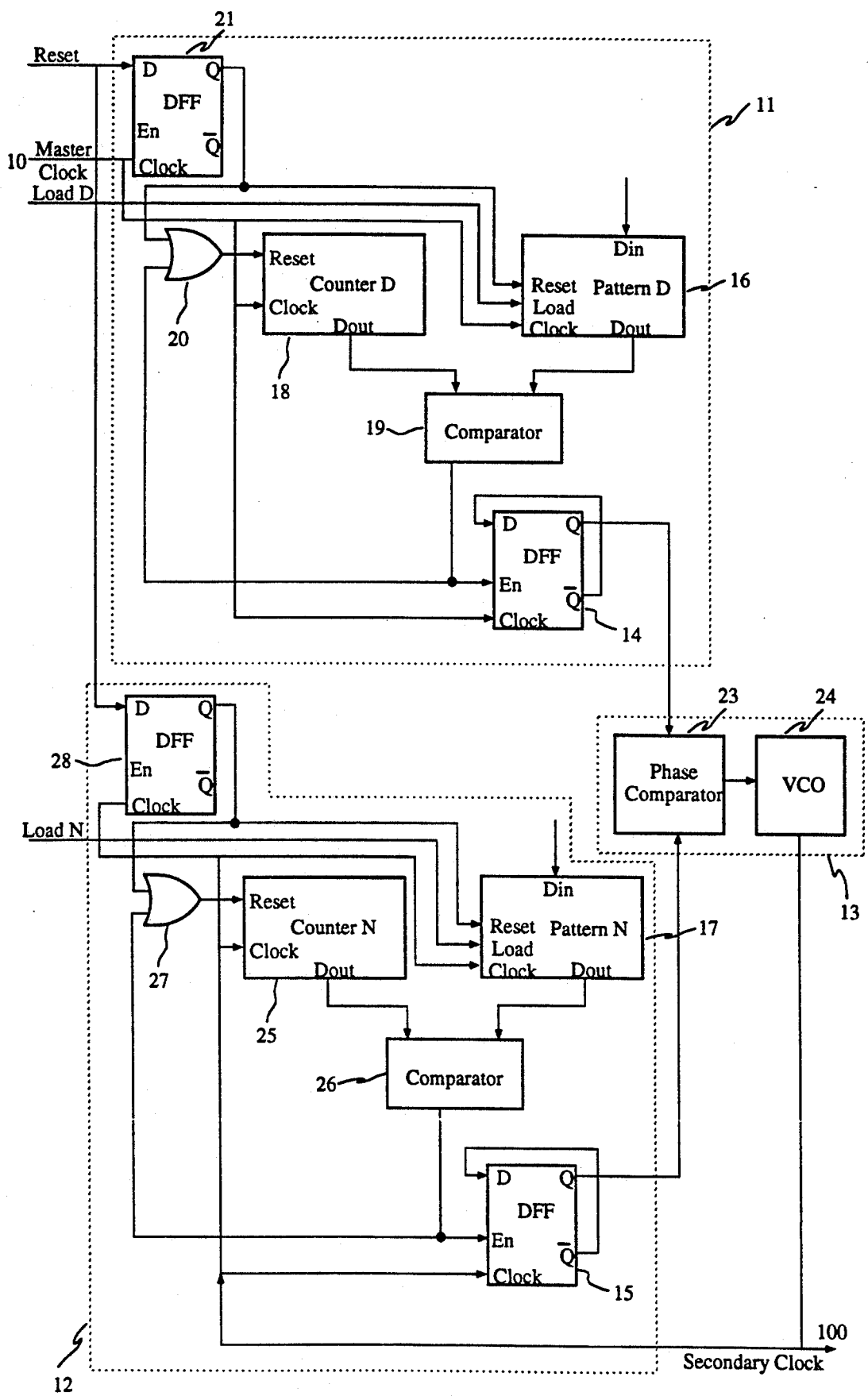
FIG. 2 illustrates a preferred embodiment block diagram of the circuit providing the secondary clock signal at a programmed ratio to the master clock signal in accordance with the present invention.

Referring now to FIG. 2, the preferred embodiment of the present invention is illustrated. The preferred embodiment of the present invention utilizes registers 16 and 17 for storing the programmed ratio. The actual values that will be stored in the register will be the respective numerator and denominator each subtracted by 1. That is, in the example of converting a 40 megahertz master clock to a 30 megahertz secondary clock, a ratio of ¾, the N register 17 will have stored in it the value 2 (3-1). Similarly, the denominator of the ratio, 4, will be stored as a 3 in the D register 16 (4-1).

The divide by programmable denominator portion 11 of FIG. 1 will now be described with respect to its component elements shown in FIG. 2. First, after everything has been cleared prior to initialization, the value of the ratio's denominator minus 1 will be stored in the D register 16. This is done by asserting the Load D signal to the register and supplying the value to the register through its Din input. Also upon initialization, the D counter 18 is reset. Then, for each cycle of the master clock, the D counter 18 is incremented by 1. The counter is incremented for each cycle of the master clock until the counter and register 16 have the same value. Thus, for a ratio in which the denominator is 4, a 3 will be stored in the D register 16 and the counter will count from 0 to 3, i.e., for 4 clock cycles. When the counter value and register value are equivalent, the comparator 19 signals the enable input of the D flip-flop 14. It is the D flip-flop 14 which performs the divide-by-two as shown in FIG. 1. Upon receiving an enable signal, the D flip-flop passes its $\overline{Q}$ output to its D input.

The D counter 18 is reset because the gate 20 is also tied to the output of the comparator 19 which has indicated that the register 16 and counter 18 have equivalent values. The counter then increments for each cycle of the master clock until the counter 18 value again equals the D register 16 value. The comparator 19 then again enables the D flip-flop which now outputs its high Q value to the PLL 13.

The PLL 13 is shown in FIG. 2 as being made up of its constituent components, a phase comparator 23 and a voltage control oscillator (VCO) 24. In light of the above-described process of the divide circuitry 11, it can be seen that the phase comparator 23 sees an indicated clock cycle for every master clock cycle divided by twice the ratio denominator.

The frequency multiplier circuitry portion 12 of FIG. 1 will now be described with respect to its elements shown in FIG. 2. First, upon initialization, a value is stored in the N register 17 in a manner similar to the storing the D value described above. For the 40 megahertz to 30 megahertz ratio, the numerator of the ratio is 3. Therefore, the value stored in the N register 17 is a 2. As with the frequency divider circuitry, the multiplier circuitry actually performs a divide which serves as the second input to the phase comparator 23. A counter 25 is utilized which increments for each secondary clock cycle from 0 to the value in the N register 17. When the counter 25 has counted as many secondary clock signals as the value in the N register 17, the comparator 26 toggles the D flip-flop 15. The D flip-flop 15 then outputs its $\overline{Q}$ value to its D input thus providing the divide-by-two circuitry for the frequency multiply side as described with respect to FIG. 1. After this process is completed a second time, the D flip-flop passes a high Q value to the phase comparator 23. Thus, the secondary signal is passed to the phase comparator 23 on the multiply side for every secondary clock signal times the ratio numerator times 2. The phase comparator compares the divide side and multiply side signals and adjusts the voltage of the VCO 24. The VCO 24 then outputs the secondary clock signal 100 as a result of the comparison by the phase comparator 23.

The gate 27 of FIG. 2 performs the same function as the gate 20. That is, after the comparator 26 has indicated that the N counter 25 and the N register 27 have equal values, the counter is reset to 0. The D flip-flop 28, like the D flip-flop 21, is used for initializing and resetting so that both portions of the circuit begin at the same time. After initialization, a number of clock cycles will have to be cycled through before the secondary clock settles at a frequency equal to the master clock signal times the programmed ratio. Once this occurs, the PLL 13 will lock the secondary clock with low skew at the frequency of the master clock multiplied by the programmed ratio. Again, the reason for the divide-by-two circuit 14 is to present to the PLL the signal with an approximately 50/50 duty cycle.

Figure 3:
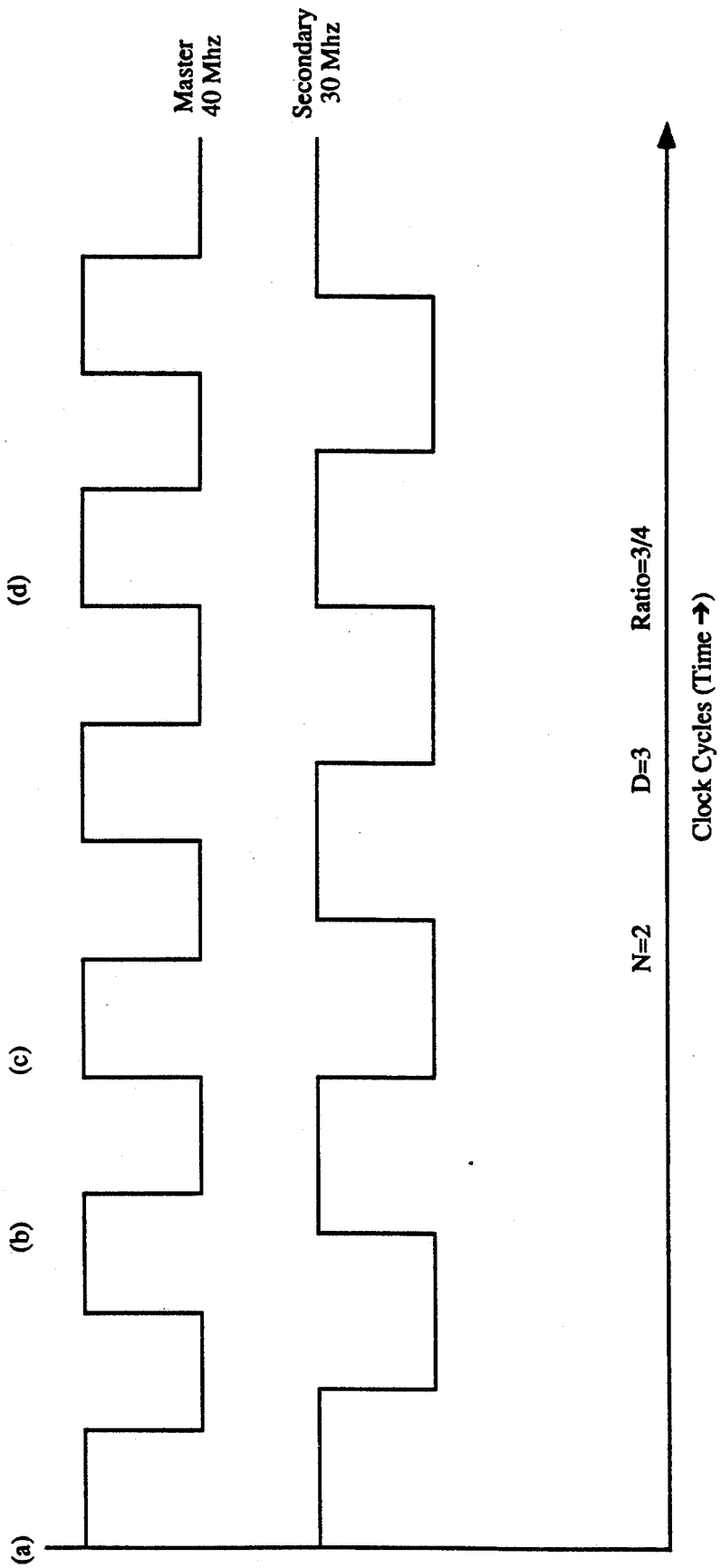
FIG. 3 shows a timing diagram illustrating the secondary clock signal as a function of the primary clock signal as a result of being operated on by the present invention with the programmed ratio.

The value of the present invention will now be described with respect to a timing diagram shown. Referring now to FIG. 3, a timing diagram illustrating a plurality of clock cycles for both the master clock signal and the secondary clock signal are illustrated. Consistent with the example that has been used, the master clock signal of FIG. 3 is one which is running at 40 megahertz. The interface to which the secondary clock signal is being supplied requires a 30 megahertz clock signal. Therefore, it is desired to supply a clock signal to the interface at $\frac{3}{4}$ the clock rate of the master clock signal. As described above, this requires storing in the D register 16 the value of 3 and in the N register 17 the value of 2. The timing diagram shown in FIG. 3 shows several clock pulses for the master and secondary clock signals once the PLL 13 has settled and the secondary clock is at the desired ratio to the master clock.

Because the secondary clock is driven and locked to the master clock, a number of well-defined relationships between the two clock signals may be anticipated by the interface. As can be seen in FIG. 3, at a point (a) in the timing cycles, both clocks experience the rising edge of a clock pulse. Because of the ratio between the two clock signals, this will only occur every fourth cycle for the master clock and every third cycle for the secondary clock. However, the relationship between the clock cycles is very predictable because of the locking nature of the PLL. At a point (b) the secondary clock signal is at the rising edge of the second clock cycle. At the same point (b), the master clock signal is already into its second cycle, but it has passed it by a readily determined amount, in this case, $\frac{1}{3}$ of a clock pulse. Further into the timing cycles, it can be seen at a point (c) that the two clocks are exactly 180 degrees out of phase. Note that the offset at point (c) is not clock skew because the clock edges are exactly where they are expected when a 30 megahertz clock and 40 megahertz clock are compared at that point. Any interface or component that is driven by the secondary clock knows the timing relationship to the master clock. At a point (d) in the clock cycles, the two wave forms are shown to be in phase again with both at the rising edge of a clock cycle. As described, this occurs after four clock cycles for the master clock and after three clock cycles for the secondary clock. Knowing all possible relationships between the clocks allows a designer to know how much logic can be placed between the flip-flops when crossing the boundary between clock domains while still maintaining a correctly functioning synchronized design.

The present invention is not limited to producing a secondary clock signal which is longer than the master clock. The timing diagrams of FIG. 3 might just as well have illustrated a master clock of 30 megahertz and a secondary clock signal of 40 megahertz. In such a case, the ratio would be 4/3 with the N value being stored as 3 and the D value being stored as 2. The master clock would still be divided down first and then multiplied up and locked by the PLL. Such an ability to generate a faster secondary clock signal is desirable where there is a high speed component in the system.

In addition to creating secondary clock signals at a programmed ratio to the master clock signal, if it is desirable to have an interface running at the same clock rate as the master clock, it can either bypass the circuitry altogether or include the circuitry and store identical N and D values, usually a zero. It would be advantageous to include the circuitry of the present invention even where the interface requires a clock signal equal to the master clock because if the master clock were changed for some reason, the interface will still be able to have its desired clock frequency by changing the programmed values in the D and N registers.

Although the present invention has been described in terms of a preferred embodiment and alternatives, it will be appreciated that various modifications and alterations might be made by those skilled in the art without departing from the spirit and scope of the invention.

The invention should, therefore, be measured in terms of the claims which follow.

What is claimed is:

1. A clock signal generating apparatus for generating a second clock signal equal to the product of a first clock signal and a desired ratio, said ratio having a numerator and a denominator, said clock signal generating apparatus comprising:

frequency divider means for dividing the frequency of said first clock signal by the denominator of said ratio to yield a first divided clock signal, said frequency divider means comprising:
a first storage means for storing the value of the denominator of said ratio, said first storage means being selectively programmable;
a first incremental counting means responsive to said first clock signal, said first counting means incrementing for each clock cycle of said first clock signal; and
a first comparator means coupled to said first storage means and said first incremental counting means for comparing the value in said first storage means to the incrementing value of said first counting means, said first comparator outputting said first divided clock signal when said first storage means and said first incremental counting means have equal values and for signaling said first incremental counting means to reset at the same time;

frequency multiplier means responsive to said first divided clock signal for multiplying said first divided clock signal by the numerator of said ratio to yield said second clock signal at a frequency of said first clock signal multiplied by said ratio, said frequency multiplier means comprising:
a second storage means for storing the value of the denominator of said ratio, said second storage means being selectively programmable;
a second incremental counting means responsive to said second clock signal, said second counting means incrementing for each clock cycle of said second clock signal;
a second comparator means coupled to said second storage means and said second incremental counting means for comparing the value in said second storage means to the incrementing value of said second counting means, said second comparator outputting a second divided clock signal when said second storage means and said second incremental counting means have equal values and for signaling said second incremental counting means to reset at the same time;
a phase locked loop (PLL), said PLL receiving said first divided clock signal and said second divided clock signal as inputs, said PLL outputting said second clock signal; and
first and second divide-by-two means, said first divide-by-two means being coupled between said first comparator means and said PLL, and said second divide-by-two means being coupled between said second comparator means and said PLL, said first and second divide-by-two means for providing approximately a 50/50 duty cycle for said PLL and each of said divide-by-two means approximately canceling any skew introduced by the other.

2. The clock signal generating apparatus of claim 1 wherein said first and second divide-by-two means comprise first and second D flip-flops.

3. The clock signal generating apparatus of claim 2 further comprising synchronized reset means for simultaneously resetting said frequency multiplier and frequency divider means.

4. A secondary clock generator for outputting a second clock signal at a frequency equal to a first clock signal multiplied by a ratio having a numerator and a denominator, said secondary clock generator comprising:

first and second storage registers for storing the values of said numerator and denominator each subtracted by one, respectively;
first and second counters responsive to said first and second clock signals respectively, said counters incrementing for each detected clock cycle,
first and second comparators, said first comparator coupled to said first storage register and said first counter, said second comparator coupled to said second register and said second counter, said first and second comparators outputting first and second divided clock signals respectively upon said first and second comparators detecting equivalent values, said first and second comparators also signaling said first and second counters to reset respectively upon said outputting of said first and second divided clock signals;
first and second divide-by-two circuits coupled to said first and second comparators respectively, for dividing said first and second divided clock signals by two; and
a phase locked loop (PLL) coupled to said first and second divide-by-two circuits and responsive to said divided clock signals for generating said second clock signal at a frequency to said first clock signal multiplied by said ratio.

5. The secondary clock generator of claim 4 wherein said divide-by-two circuits comprise D-flip-flops, each having a $\overline{Q}$ output coupled to a D input.

6. A method of generating a second clock signal at a frequency equal to the product of a first clock frequency and a desired ratio, said ratio having a numerator and a denominator, said method comprising the steps of:

storing said denominator and numerator in first and second storage registers respectively;
incrementing first and second counters for each cycle of said first and second clock frequencies respectively;
comparing said first counter value to said stored denominator in said first storage register and when the values are equivalent outputting a divided-down first clock signal and resetting said first counter;
dividing said divided-down first clock signal by two and supplying the resulting signal as a reference input to a phase locked loop (PLL);
comparing said second counter value to said stored denominator in said second storage register and when the values are equivalent outputting a divided-down second clock signal and resetting said second counter;
dividing said divided-down second clock signal by two and supplying the resulting signal as a second input to said PLL; and
outputting said second clock frequency from said PLL and using it as said second clock signal and as the input to said second counter.

* * * * *